United States Patent [19]

Takamiya et al.

[11] Patent Number: 4,581,744
[45] Date of Patent: Apr. 8, 1986

[54] SURFACE EMITTING INJECTION TYPE LASER DEVICE

[75] Inventors: Saburo Takamiya, Sanda; Shigeki Horiuchi, Amagasaki; Kaname Otaki; Yoshihiro Kokubo, both of Itami, all of Japan

[73] Assignee: Mitsubishi Denki Kabushiki Kaisha, Tokyo, Japan

[21] Appl. No.: 485,583

[22] Filed: Apr. 14, 1983

[30] Foreign Application Priority Data

Apr. 15, 1982 [JP] Japan ................................. 57-64371

[51] Int. Cl.[4] ............................................... H01S 3/19
[52] U.S. Cl. ......................................... 372/92; 357/17; 372/44; 372/50
[58] Field of Search ................... 372/44, 50, 97, 19, 372/92; 357/17; 350/96.15

[56] References Cited

U.S. PATENT DOCUMENTS 4,101,845  7/1978  Russer .................................... 372/50
4,358,851  11/1982  Scifres et al. .......................... 372/97

OTHER PUBLICATIONS

H. Soda et al., "GaIn As P/InP Surface Emitting Injection Lasers", Japan Journal of Applied Physics, vol. 18, (1979), No. 12, pp. 2329–2330.

Primary Examiner—James W. Davie
Attorney, Agent, or Firm—Wenderoth, Lind & Ponack

[57] ABSTRACT

A surface-emitting injection type laser device has a semiconductor wafer including a first and a second main face opposite to each other and an active layer located on the side of the first main face. A single mode optical fiber chip has a first and second end surface perpendicular to its optical axis and is disposed on the semiconductor wafer with the first end surface contacting the second main face through a reflection preventing film. A dielectric film is disposed on the second end surface of the optical fiber chip to increase the reflection power at the second end surface and forming a resonator with the first main face of the semiconductor wafer.

4 Claims, 1 Drawing Figure

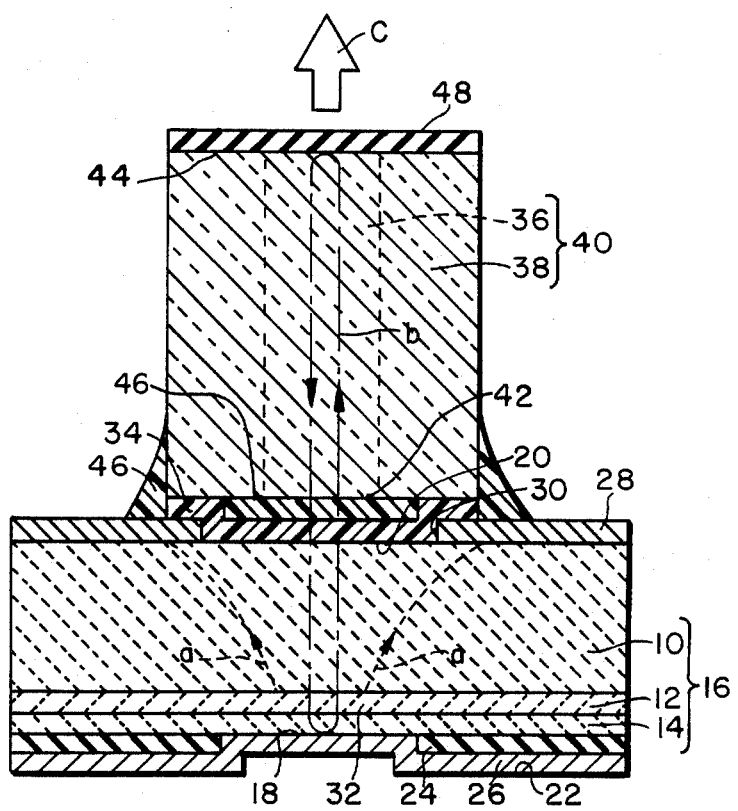

SURFACE EMITTING INJECTION TYPE LASER DEVICE

BACKGROUND OF THE INVENTION

This invention relates to a semiconductor laser device, and more particularly to improvements in a surface-emitting injection type laser device.

Semiconductor laser devices include current injection type laser diodes, utilizing a pn junction, which utilizes pumping due to the irradiation with electron rays or light and so on. Among them the laser diodes have been alreadily utilized in many systems as practical devices because the laser diodes have a high power efficiency and can be easily used. These laser diodes are required to effect the laser oscillation in the transverse dominant mode for almost all services. The laser oscillation in the transverse dominant mode has a distribution of light intensities in a plane perpendicular to the direction of propagation of light including a single lumped peak of light intensity on an associated optical axis and a light intensity on each side of the optical axis steadily decreased with an increase in distance from the optical axis in that plane. Accordingly it is extremely important to materialize the transverse dominant mode in practical laser devices.

In laser devices of the type emitting light through the plane of cleavage thereof there have been heretofore established techniques of effecting the laser oscillation in the transverse dominant mode by providing a distribution of refractive indices or a distribution of gains on laser chips involved. In surface-emitting injection type laser devices, however, there has not been discovered a measure to produce the transverse dominant mode in practical devices. This is because the semiconductor wafer has the main face orthogonal to the associated optical axis so that, from the standpoint of the manufacturing process it is technically difficult to provide a distribution of refractive indices or a distribution of gains on the particular laser chip.

A conventional surface-emitting injection type semiconductor laser device has comprised an n type indium phosphide (InP) substrate, an undoped active layer formed of a combination of indium, gallium, arsenic and phosphor (InGaAsP) whose composition is selected to be smaller in forbidden band width than indium phosphide (InP) and disposed on one of the main opposite faces of the substrate, a p type indium phosphide (InP) layer disposed on the active layer, an electrically insulating film with a central window disposed on the p type indium phosphide layer, and an anode electrode disposed on the electrically insulating film and within the window. Then a cathode electrode with a central window has been disposed on the other main face of the substrate with the central window opposed to that on the electrically insulating film and a dielectric film has been disposed within the window on the cathode electrode and on that portion of the electrically insulating film adjacent to the window to increase the refractive index of the other main face.

When a forward voltage is applied across the anode and cathode electrodes, an injection current flows to that portion of the cathode electrode contacted by the other main face of the substrate from that portion of the anode electrode contacted with the p type indium phosphide layer to make the carrier density on the central portion of the active layer high until the so-called population inversion is reached resulting in the simulated emission of photons. Then light is amplified by means of the simulated emission while receprocating between the surface of the p type indium phosphide layer and the other main face of the substrate forming a resonator therebetween. This has resulted in a laser oscillation. Light originating from the laser oscillation has partly passed through the dielectric film to be emitted externally.

In the conventional laser device as described above, a semiconductor wafer or a laser chip formed of the n type substrate, the active layer and the p type layer has a refractive index uniform in a direction perpendicular to the optical axis along which the light reciprocates and the central portion of the active layer has produced thereon a distribution of carrier densities enhanced due to a form factor but the enhanced distribution of carrier densities is not effective for controlling the transverse dominant mode. Although a weak mode selectivity is developed resulting from the form factor that the dominant mode is apt to be excited because of the fact that the surface of the p type layer and the other main face of the substrate form a pair of parallel plane mirrors and only the central portion of the active layer forms a simulated emission region, the thickness of each of the substrate and respective layers is not actually perfectly uniform, and the distribution of carrier densities varies dependent upon the light intensity which is inevitably attended with a change in distribution of refractive indices. Conventional laser devices do not have the mode selectivity capable of withstanding the imperfectness of the thickness and changes in distributions of carrier densities and refractive indices. Accordingly there has been the disadvantage that the controlled transverse dominant mode is not actually obtained.

Accordingly it is an object of the present invention to provide a new and improved surface-emitting injection type semiconductor laser device which can be easily manufactured by existing manufacturing processes and which is operative in the transverse dominant mode.

SUMMARY OF THE INVENTION

The present invention provides a surface-emitting injection type semiconductor laser device comprising a semiconductor wafer including a first main face forming a first mirror plane, a second main face opposite to the first main face, and an active layer located on the side of the first main face, and a single mode optical fiber chip including a first and a second end surface perpendicular to the optical axis of the chip the second end surface forming a second mirror plane, the single mode optical fiber chip being disposed on the semiconductor wafer by having the first end surface thereof contacting the second main face of the semiconductor wafer and the optical axis thereof aligned with that of the semiconductor wafer.

In a preferred embodiment of the present invention the first end surface of the optical fiber chip may be contacted by the second main face of the semiconductor wafer through a reflection preventing film having a refractive index lying between refractive indices of the semiconductor wafer and the optical fiber chip. Further the second end surface of the optical fiber chip may have disposed thereon a dielectric film for controlling a reflection power on the second end surface of the optical fiber chip.

BRIEF DESCRIPTION OF THE DRAWING

The present invention will become more readily apparent from the following detailed description taken in conjunction with the accompanying drawing in which a single FIGURE is a sectional view of one embodiment of the surface-emitting injection type semiconductor laser device of the present invention.

DESCRIPTION OF THE PREFERRED EMBODIMENT

Referring now to the drawing, there is illustrated one embodiment of the surface-emitting injection type semiconductor laser device of the present invention. The arrangement illustrated comprises an n type indium phosphide (InP) substrate 10 having a pair of main opposite faces, an undoped active layer 12 formed of a combination of indium, gallium, arsenic and phosphor (InGaAsP) having a composition selected to be smaller in forbidden band width than indium phosphide (InP) and disposed on one of the main opposite faces of the substrate 10 and a p type indium phosphide layer 14 disposed on the active layer 12 to form a semiconductor wafer or a laser chip generally designated by the reference numeral 16 including a first main face 18 and a second main face 20 forming the other main face of the substrate 10 and having an optical axis perpendicular to faces 19 and 20 and at the center of these faces.

Then an electrically insulating film 22 is disposed on the p type indium phosphide layer 14 and includes a central window 24 formed by removing the corresponding portion thereof. Following this an anode electrode 26 is disposed on the elelctrically insulating film 22 and within the window 24 to contact the exposed surface portion of the p type indium phosphide layer 14 at the center thereof.

Disposed on the second main face 20 of the semiconductor wafer 16 is a cathode electrode 28 which includes a central window 30 formed by removing a corresponding portion of electrode 28. The window 30 is opposed to the window 24 in the electrically insulating film 22.

In the conventional laser device as described above. A dielectric film is disposed within the window 30 on the cathode electrode 28 to contact the exposed portion of the second main face 20 and also on that portion of the cathode electrode 28 adjacent to the window 30. As described above, light reciprocates between the first and second main faces 18 and 20 respectively forming a resonator therebetween while being amplified with the simulated emission occurring on the central portion of 32 of the active layer 12 resulting in the laser oscillation. But the abovementioned disadvantage has resulted.

According to the present invention, a reflection preventing film 34 is disposed within the window 30 on the cathode electrode 28 to contact the exposed portion of the second main face 20 and also on that portion of the cathode electrode 28 adjacent to the window 30 in place of the dielectric film as described above. Also optical fibers are used to form a single mode optical fiber chip 40 coextensive with reflection preventing film 34 including a core 36 and a cladding 38 surrounding in intimate contact relationship the core 36. The optical fiber chip is generally designated by the reference numeral 40 and has an optical axis extending from end to end and a pair of first and second end surfaces 42 and 44 respectively perpendicular to the optical axis thereof. The single mode optical fiber chip 40 is fixed to the semiconductor wafer 16 by having the first end surface 42 contacting the reflection preventing film 34 through a resinous layer 46 interposed therebetween and also by disposing a resin also fillet designated by the reference numeral 46a on the end portion of the chip 40 adjacent to the first end surface 42, the periphery of the film 34 and the adjacent portion of the cathode electrode 28. The optical fiber chip 40 has also a dielectric film 48 disposed on the second end surface 44.

It is to be noted that the optical fiber chip 40 is positioned on the semiconductor wafer 16 so that the core 36 is centered on the central portion 32 of the active layer 14. In other words the optical axis of the optical fiber column 40 is aligned with that of the semiconductor wafer 16.

The reflection preventing film 34 has a refractive index lying between refractive indices of the semiconductor wafer 16 and the optical fiber column 40. The dielectric film 48 controls a reflection power at the second end surface 44 to enhance the reflection of light from that surface.

The first main face 18 of the semiconductor wafer 16 forms a first mirror plane and the second end surface 44 forms a second mirror plane to form a resonator therebetween.

The arrangement illustrated is identical in operation to the conventional laser device as described above excepting that light reciprocates between the first main face 18 of the semiconductor wafer 16 and the second end surface 44 of the single mode glass fiber chip 40. In other words, the light travels within the resonator formed of the first main face 18 and the upper end surface 44 as shown at broken line b. In the drawing the reference character a designates an injection current flowing from the anode to the cathode electrode and the arrow c designates laser light emitted through the dielectric film 48.

Since the single mode optical fiber chip 40 forms one part of the resonator, the optical loss becomes large for any mode other than the transverse dominant mode. Thus oscillations are difficult in other modes. In other words, a mode filter is operatively incorporated into the resonator to permit propagation of the transverse dominant mode alone.

As described above the purpose of the reflecting dielectric film 48 disposed on the second end surface 44 of the optical fiber chip 40 is to promote the reflection of light from that end surface 44 of the optical fiber chip 40 while the purpose of the reflection preventing film 34 disposed on the second main face 20 of the semiconductor wafer 16 is to decrease the reflection of light from that main face. Thus the film 34 cooperates with the film 48 to prevent the resulting resonator from being of the composite type.

From the foregoing it is seen that in the surface-emitting injection type semiconductor laser device of the present invention a resonator is formed of a first main face of a semiconductor wafer and a second end surface of a single mode optical fiber chip including a first end surface contacted by a second main face of the semiconductor wafer. Thus the laser device can put to practical use the property of a mode filter that only the transverse dominant mode possessed by the single mode optical fiber chip is permitted, resulting in the production of an oscillation in the transverse dominant mode. Further since the optical fiber chip is only fixed to the semiconductor wafer no special measure to do so is required. In addition, the positioning of the core of the optical fiber chip on the simulated emission region of the semiconductor wafer can be satisfactorily effected by using the presently approximately established technique of positioning a single mode optical fiber chip on a single mode laser device.

While the present invention has been illustrated and described in conjunction with a single preferred embodiment thereof it is to be understood that numerous changes and modifications may be resorted to without departing from the spirit and scope of the present invention. For example, it is to be understood that the present invention is not restricted to the use with the semiconductor wafer or a laser chip illustrated and that it is equally applicable to any surface-emitting injection type laser chip having an internal structure and materials different from those illustrated.

What is claimed is:

1. A surface-emitting injection type laser device comprising a semiconductor wafer having a first main face forming a first plane mirror, a second main face opposite to said first main face and an optical axis extending between said faces, an active layer located on the said first main face; and a single mode optical fiber chip having an optical axis and first and a second end surface perpendicular to said optical axis of said optical fiber chip and permitting propagation of only the transverse dominant mode, said second end surface forming a second plane mirror, said single mode optical fiber chip being disposed on said semiconductor wafer with said first end surface in optically conductive contact with said second main face of said semiconductor wafer and the optical axis of said optical fiber chip aligned with the optical axis of said semiconductor wafer.

2. A surface-emitting injection type laser device as claimed in claim 1 wherein there is a film of reflection preventing material between said first end surface of said optical fiber chip and said second main face of said semiconductor wafer, said material having a refractive index between the refractive indices of said semiconductor wafer and said optical fiber chip.

3. A surface-emitting injection type laser device as claimed in claim 3 wherein said second end face of said optical fiber chip has a dielectric film thereon for controlling the reflection power of said second end surface of said optical fiber chip.

4. A surface-emitting injection type laser device as claimed in claim 2 wherein said second end face of said optical fiber chip has a dielectric film thereon for controlling the reflection power of said second end surface of said optical fiber chip.

* * * * *